US012777592B2

(12) United States Patent
Li et al.

(10) Patent No.: US 12,777,592 B2
(45) Date of Patent: Oct. 27, 2026

(54) DISPLAY MODULE AND DISPLAY APPARATUS

(71) Applicant: Wuhan Tianma Microelectronics Co., Ltd., Wuhan (CN)

(72) Inventors: Xin Li, Wuhan (CN); Shengming Li, Wuhan (CN)

(73) Assignee: Wuhan Tianma Microelectronics Co., Ltd., Wuhan (CN)

( * ) Notice: Subject to any disclaimer, the term of this patent is extended or adjusted under 35 U.S.C. 154(b) by 72 days.

(21) Appl. No.: 19/088,901

(22) Filed: Mar. 24, 2025

(65) Prior Publication Data

US 2025/0227861 A1 Jul. 10, 2025

(30) Foreign Application Priority Data

May 13, 2024 (CN) ........................ 202410592098.8

(51) Int. Cl.
*H05K 5/02* (2006.01)

(52) U.S. Cl.
CPC ..................................... *H05K 5/02* (2013.01)

(58) Field of Classification Search
CPC ....................................................... H05K 5/00
See application file for complete search history.

(56) References Cited

U.S. PATENT DOCUMENTS 9,983,424 B2 * 5/2018 Kim .................. G02F 1/133305
2024/0361802 A1 * 10/2024 Kim ...................... G06F 1/1616

FOREIGN PATENT DOCUMENTS

| | | |
|---|---|---|
| CN | 113539076 A | 10/2021 |
| CN | 110599913 B | 2/2022 |
| CN | 114220355 A | 3/2022 |

OTHER PUBLICATIONS

Chinese Office Action mailed May 7, 2026, issued in related Chinese Application No. 202410592098.8(16 pages).

* cited by examiner

*Primary Examiner* — Jerry Wu
(74) *Attorney, Agent, or Firm* — Wiersch Law Group

(57) ABSTRACT

A display module and a display apparatus are provided. The display module includes a flexible display panel and a deformable layer. The deformable layer is located at a side of a backlight surface of the flexible display panel. The deformable layer includes a plurality of support structures. Adjacent support structures of the plurality of support structures attract each other attract each other. The display module has an unfolding state. In the unfolding state, the plurality of support structures are arranged in a plane of the deformable layer. According to the present disclosure, the flexible display panel can be bent at any angle, and the flexible display panel can be bent at different positions by setting positions of the plurality of support structures, which is conducive to increasing application scenarios of the display module.

17 Claims, 24 Drawing Sheets

DISPLAY MODULE AND DISPLAY APPARATUS

CROSS-REFERENCE TO RELATED APPLICATIONS

The present application claims priority to Chinese Patent Application No. 202410592098.8, filed on May 13, 2024, the content of which is incorporated herein by reference in its entirety.

TECHNICAL FIELD

The present disclosure relates to the field of display technologies, and in particular, to a display module and a display apparatus.

BACKGROUND

A flexible display panel has been increasingly applied due to its bendability. Especially, folding application of the flexible display panel has received increasing attention and recognition from users.

In existing foldable display apparatuses, a hinge is usually used to fold the flexible display panel. However, according to this folding method, the flexible display panel can only be folded inward or outward, which results in a simple application scenario, thereby limiting application scenarios of the flexible display panel. Therefore, the problem is urgently needed to be solved.

SUMMARY

According to a first aspect of the present disclosure, a display module is provided. The display module includes a flexible display panel and a deformable layer. The deformable layer is located at a side of a backlight surface of the flexible display panel. The deformable layer includes a plurality of support structures. Adjacent support structures of the plurality of support structures attract each other attract each other. The display module has an unfolding state. In the unfolding state, the plurality of support structures are arranged in a plane of the deformable layer.

According to a second aspect of the present disclosure, a display apparatus is provided. The display apparatus includes a display module. The display module includes a flexible display panel and a deformable layer. The deformable layer is located at a side of a backlight surface of the flexible display panel. The deformable layer includes a plurality of support structures. Adjacent support structures of the plurality of support structures attract each other attract each other. The display module has an unfolding state. In the unfolding state, the plurality of support structures are arranged in a plane of the deformable layer.

BRIEF DESCRIPTION OF DRAWINGS

In order to more clearly explain the embodiments of the present disclosure or the technical solution in the related art, the drawings to be used in the description of the embodiments or the related art will be briefly described below. The drawings in following description are some embodiments of the present disclosure. For those skilled in the art, other drawings may also be obtained based on these drawings.

DESCRIPTION OF EMBODIMENTS

In order to better understand technical solutions of the present disclosure, the embodiments of the present disclosure are described in details with reference to the drawings.

It should be clear that the described embodiments are merely part of the embodiments of the present disclosure rather than all of the embodiments. All other embodiments obtained by those skilled in the art without paying creative labor shall fall into the protection scope of the present disclosure.

The terms used in the embodiments of the present disclosure are merely for the purpose of describing specific embodiment, rather than limiting the present disclosure. The terms "a", "an", "the" and "said" in a singular form in the embodiment of the present disclosure and the attached claims are also intended to include plural forms thereof, unless noted otherwise.

It should be understood that the term "and/or" used in the context of the present disclosure is to describe a correlation relation of related objects, indicating that there may be three relations, e.g., A and/or B may indicate only A, both A and B, and only B. In addition, the symbol "/" in the context generally indicates that the relation between the objects in front and at the back of "/" is an "or" relationship.

With the continuous development of display technologies, a foldable screen is increasingly favored by users. In an existing foldable apparatus, a hinge is usually designed to fold a flexible screen. The hinge design can only control folding of a local position of the flexible screen. As a result, the flexible screen can only be folded inward or outward, resulting in a simple application scenario and manner. This restricts applicable scenarios of the foldable apparatus.

Figure 1:
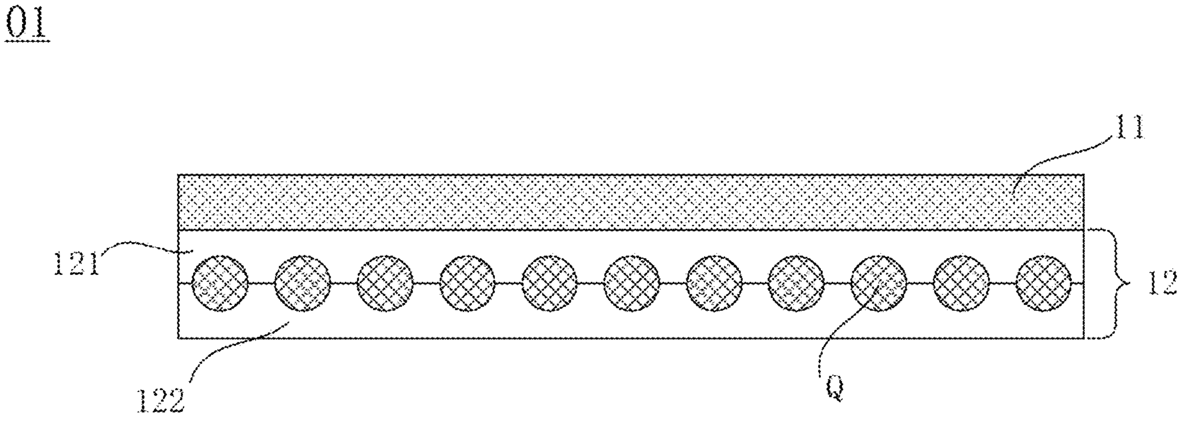
FIG. 1 is a schematic diagram of an unfolding state of a display module according to an embodiment of the present disclosure.
Figure 2:
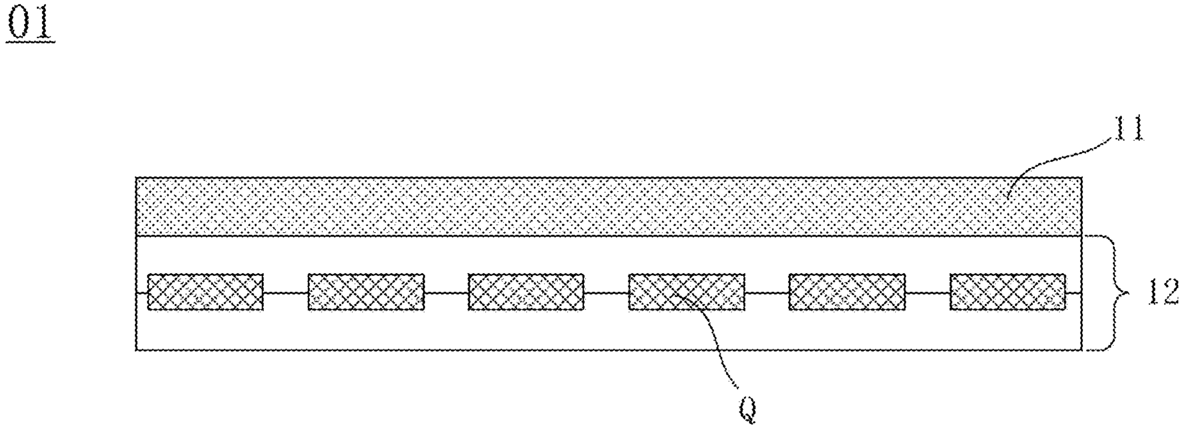
FIG. 2 is a schematic diagram of an unfolding state of a display module according to another embodiment of the present disclosure.
Figure 3:
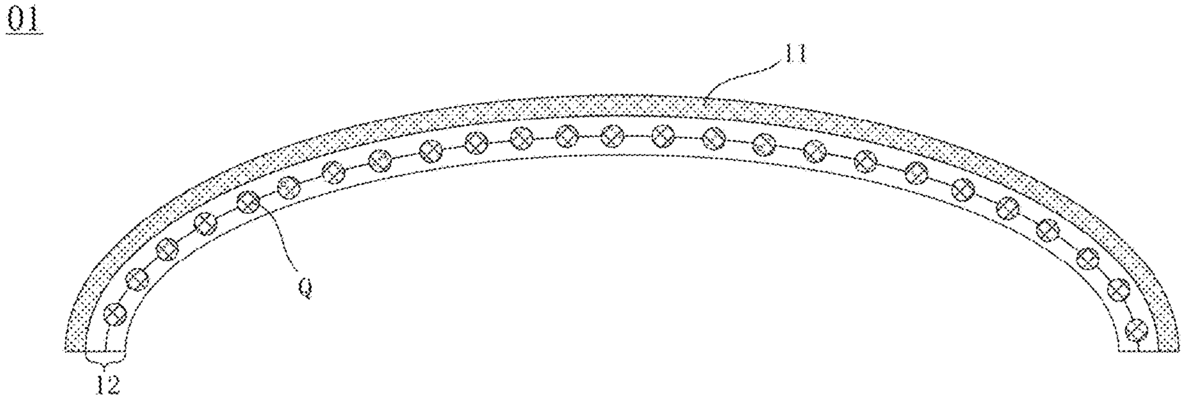
FIG. 3 is a schematic diagram of a bending state of a display module according to an embodiment of the present disclosure.

FIG. 1 is a schematic diagram of an unfolding state of a display module according to an embodiment of the present disclosure. FIG. 2 is a schematic diagram of an unfolding state of a display module according to another embodiment of the present disclosure. FIG. 3 is a schematic diagram of a bending state of a display module according to an embodiment of the present disclosure.

The present disclosure provides a display module 01. As shown in FIG. 1 and FIG. 2, the display module 01 includes a flexible display panel 11 and a deformable layer 12. The deformable layer is located at a side of a backlight surface of the flexible display panel 11. A shape of the deformable layer 12 is changeable, and can maintain stable without external force.

The deformable layer 12 includes support structures Q, and adjacent support structures Q attract each other. The support structure Q is configured to control the shape of the deformable layer 12. In an embodiment of the present disclosure, the shape of the deformable layer 12 can be changed by changing an arrangement shape of the support structure Q.

A shape of a single support structure Q is not limited in the present disclosure, provided that the adjacent support structures Q can attract each other.

For example, as shown in FIG. 1, the single support structure Q may be spherical. As shown in FIG. 2, the single support structure Q may be cuboid. The single support structure Q may alternatively be cubic.

In an embodiment of the present disclosure, the support structures Q have a same size.

The display module 01 includes an unfolding state. As shown in FIG. 1 and FIG. 2, in the unfolding state, the support structures Q are arranged in a plane of the deformable layer 12.

That is, when the support structures Q in the deformable layer 12 are arranged in a same plane, the deformable layer 12 can be in the unfolding state, and the flexible display panel 11 located at one side of the deformable layer 12 can be in the unfolding state. In this way, the display module 01 is in the unfolding state.

As shown in FIG. 3, the display module 01 further has a bending state. In the bending state, the support structures Q are arranged in a bending shape. That is, when the support structures Q in the deformable layer 12 are arranged in the bending shape, the deformable layer 12 can be in the bending state, so that the flexible display panel 11 located at the one side of the deformable layer 12 is in the bending state. In this way, the display module 01 is bent.

It should be noted that FIG. 3 only illustrates inward bending of the display module 01, and the bending state of the display module 01 can further include outward bending. It can be understood that the display module 01 can be folded.

In an embodiment of the present disclosure, the support structures Q are disposed in the deformable layer 12, and mutual attraction between the support structures Q can enable the support structures Q to form an arbitrary shape, thereby driving the deformable layer 12 to undergo deformation. The flexible display panel 11 follows the deformation of the deformable layer 12 to undergo deformation. In this way, the flexible display panel 11 can be bent at any angle, and can be bent at different positions by setting positions of the support structures Q, which is conducive to increasing application scenarios of the display module 01. Moreover, the mutually attracted support structures can further maintain the bending state after being bent. This prevents the bent flexible display panel from recovering to a state before the deformation to affect use.

In an embodiment of the present disclosure, the support structure Q has magnetism, and the adjacent support structures Q can attract each other through magnetic force.

In an embodiment of the present disclosure, the support structure Q is made of a neodymium iron boron material. Further, the support structure Q may be a buckyball.

Figure 4:
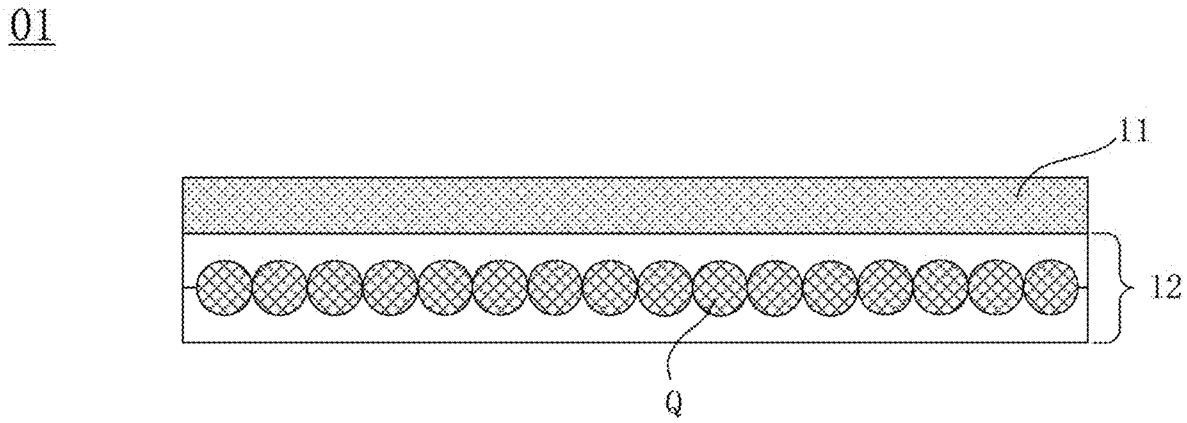
FIG. 4 is a schematic diagram of an unfolding state of a display module according to another embodiment of the present disclosure.

FIG. 4 is a schematic diagram of an unfolding state of a display module according to another embodiment of the present disclosure.

In an embodiment of the present disclosure, as shown in FIG. 4, in the deformable layer 12, the adjacent support structures Q come into contact with each other. In this way, the mutually attracted support structures Q can be connected together, making the support structures Q to form a stable shape. This is conducive to improving stability of the deformable layer 12 after the deformation, thereby improving stability of the flexible display panel 11 in the bending state.

Figure 5:
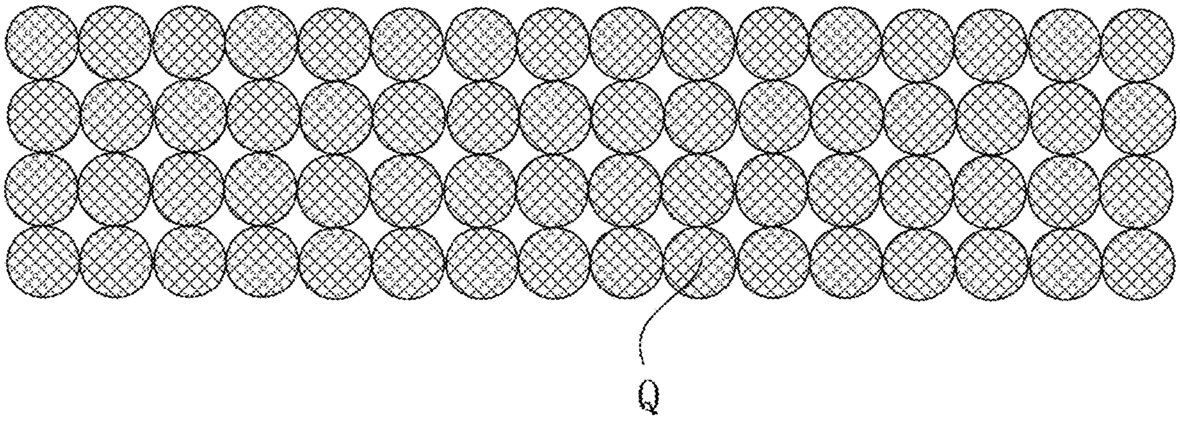
FIG. 5 schematically shows an arrangement of a support structure according to an embodiment of the present disclosure.
Figure 6:
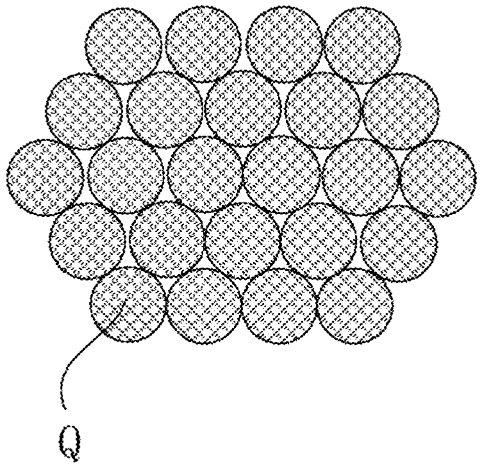
FIG. 6 schematically shows an arrangement of a support structure according to an embodiment of the present disclosure.

FIG. 5 schematically shows an arrangement of a support structure according to an embodiment of the present disclosure. FIG. 6 schematically shows an arrangement of a support structure according to an embodiment of the present disclosure.

In an embodiment of the present disclosure, the support structures Q are arranged in an array. In other words, the support structures Q can be arranged according to a certain rule in the deformable layer 12.

For example, as shown in FIG. 5, in the unfolding state, orthographic projection of a shape formed by the support structures Q on the plane of the deformable layer 12 is a rectangle. As shown in FIG. 6, in the unfolding state, the orthographic projection of the shape formed by the support structures Q on the plane of the deformable layer 12 is a hexagon.

In an embodiment of the present disclosure, the support structures Q are arranged in the array, so that the shape formed by the support structures Q is more stable, thereby maintaining structural stability of the flexible display panel 11 in the bending state.

In an embodiment of the present disclosure, in the unfolding state, a shape of orthographic projection of a structure formed by the support structures Q on the plane of the deformable layer 12 is the same as a shape of orthographic projection of the flexible display panel 11 on the plane of the deformable layer 12, and all support structures Q can be disposed in one surface. For example, for a circular display panel, the shape of the orthographic projection of the structure formed by the support structures Q on the plane of the deformable layer 12 is a circle. For a rectangular display panel, the shape of the orthographic projection of the structure formed by the support structures Q on the plane of the deformable layer 12 is a rectangle.

Still referring to FIG. 1, in an embodiment of the present disclosure, the deformable layer 12 includes a first flexible layer 121 and a second flexible layer 122, and the support structures Q are located between the first flexible layer 121 and the second flexible layer 122. The support structure Q can come into contact with the first flexible layer 121 and the second flexible layer 122.

In an embodiment of the present disclosure, the first flexible layer 121 is located at a side of the second flexible layer 122 facing the flexible display panel 11.

In an embodiment of the present disclosure, the first flexible layer 121 and the second flexible layer 122 are made of at least one of a silicone material, a resin material, and a polyimide material.

In an embodiment of the present disclosure, the first flexible layer 121 and the second flexible layer 122 can bear and fix the support structure Q, which is conducive to achieving stability of a pattern formed by the support structures Q.

Figure 7:
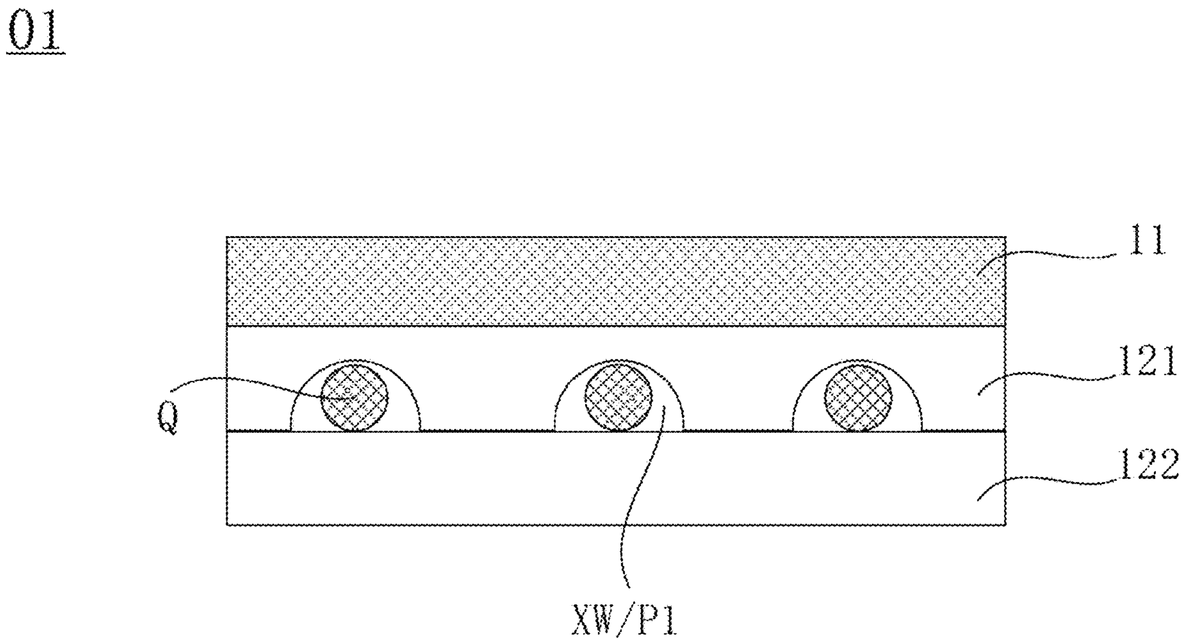
FIG. 7 schematically shows a partial enlarged view of a display module according to an embodiment of the present disclosure.
Figure 8:
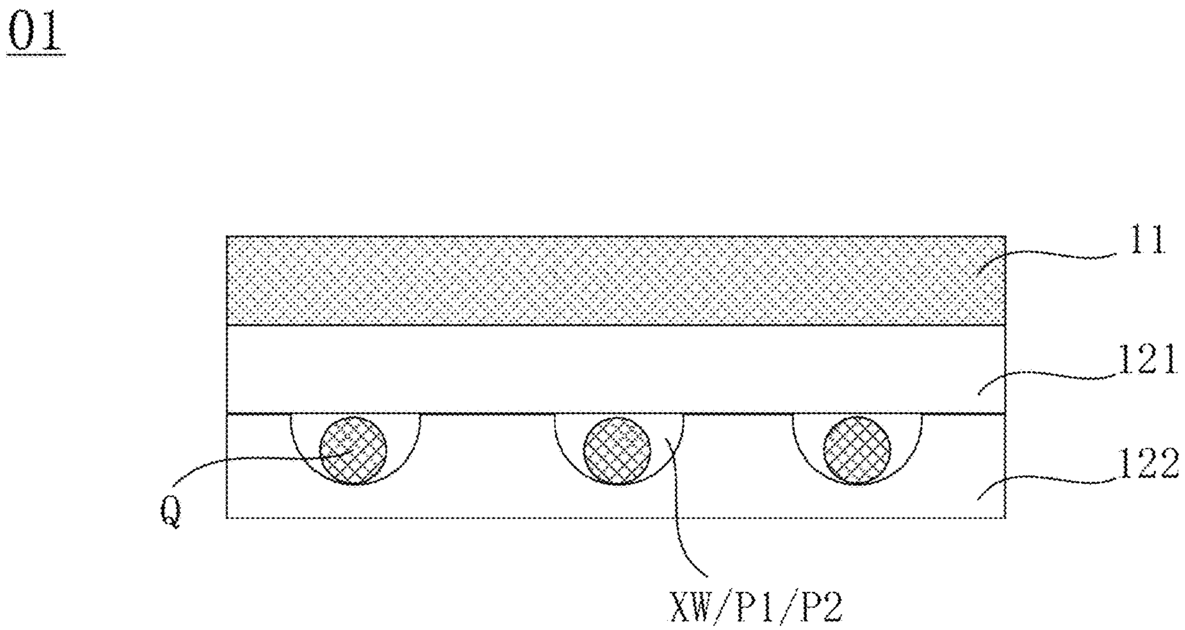
FIG. 8 schematically shows a partial enlarged view of a display module according to another embodiment of the present disclosure.
Figure 9:
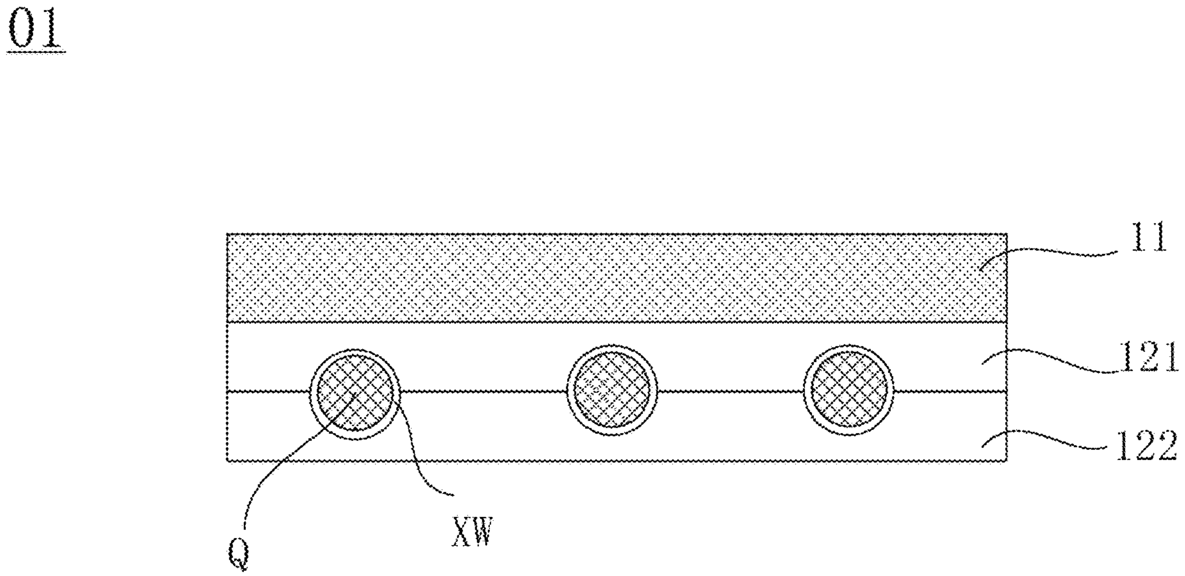
FIG. 9 schematically shows a partial enlarged view of a display module according to another embodiment of the present disclosure.

FIG. 7 schematically shows a partial enlarged view of a display module according to an embodiment of the present disclosure. FIG. 8 schematically shows a partial enlarged view of a display module according to another embodiment of the present disclosure. FIG. 9 schematically shows a partial enlarged view of a display module according to another embodiment of the present disclosure.

In an embodiment of the present disclosure, referring to FIG. 7 to FIG. 9, at least one of the first flexible layer 121 and the second flexible layer 122 is provided with a limit structure XW. The limit structure XW is configured to limit movable space of the support structure Q.

In other words, as shown in FIG. 7, the limit structure XW may be disposed only in the first flexible layer 121. Alternatively, as shown in FIG. 8, the limit structure XW may be disposed only in the second flexible layer 122. Alternatively, as shown in FIG. 9, the limit structure XW may be disposed in the first flexible layer 121 and in the second flexible layer 122.

In an embodiment of the present disclosure, the limit structure XW can fix a position of the support structure Q relatively, and prevent significant displacement of the support structure Q in a bending process of the display module 01. This helps to achieve stability of a bent form of the deformable layer 12, thereby facilitating structural stability of the display module 01.

In an embodiment of the present disclosure, as shown in FIG. 7, the limit structure XW includes a groove P1, and the support structure Q is located in the groove P1. In this way, the groove P1 is used to limit the movable space of the support structure Q. It can be understood that the groove P1 can be disposed on at least one of the first flexible layer 121 and the second flexible layer 122.

In an embodiment of the present disclosure, a thickness of the groove P1 is smaller than a thickness of the first flexible layer 121 or the second flexible layer 122 in which the groove P1 is located, in order to prevent the support structure Q from exposing from the first flexible layer 121 or the second flexible layer 122 to cause loose limiting.

Figure 10:
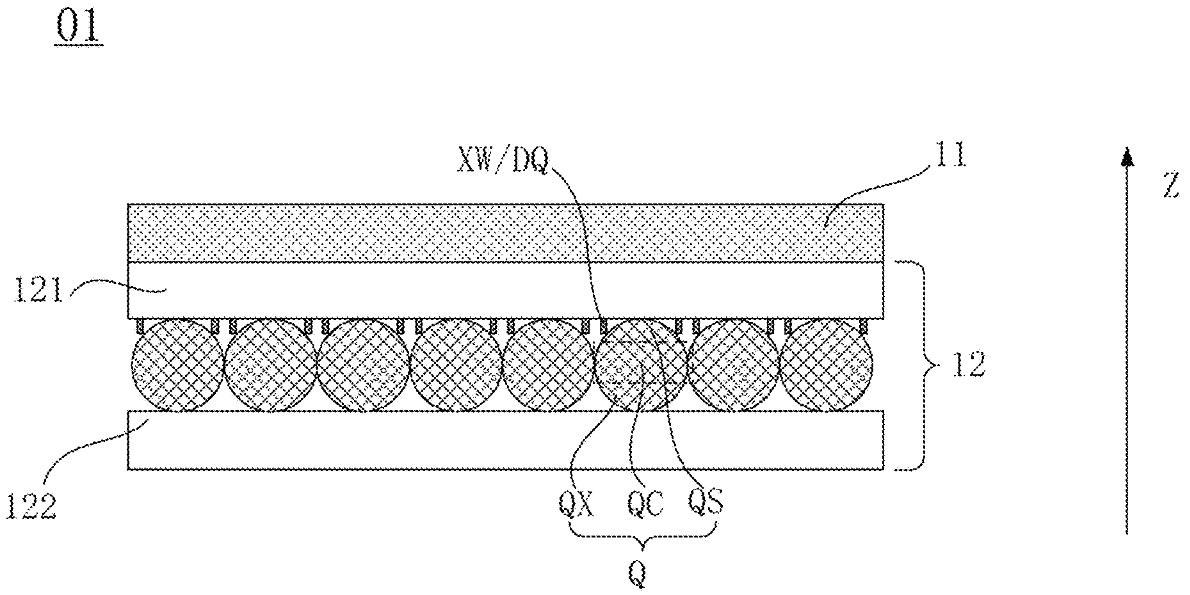
FIG. 10 is a schematic diagram of an unfolding state of a display module according to another embodiment of the present disclosure.
Figure 11:
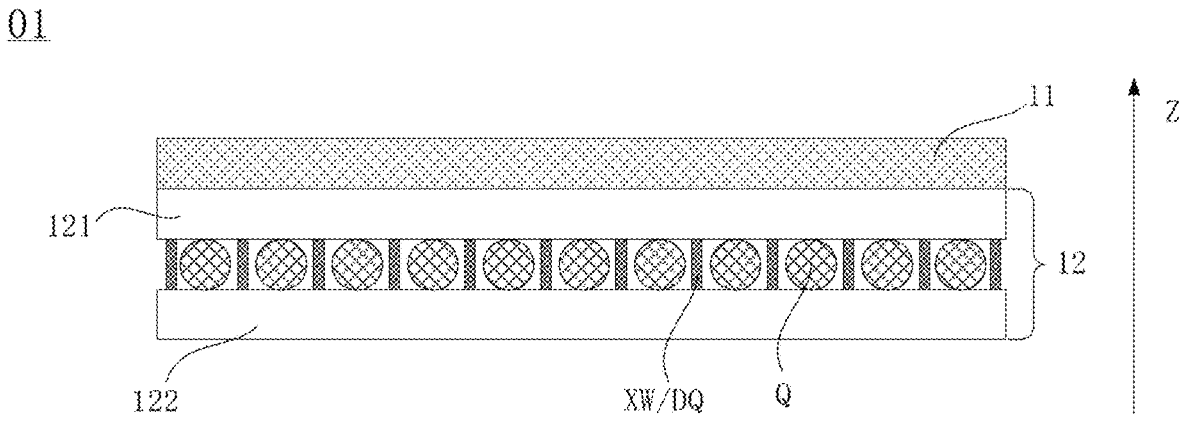
FIG. 11 is a schematic diagram of an unfolding state of a display module according to another embodiment of the present disclosure.
Figure 12:
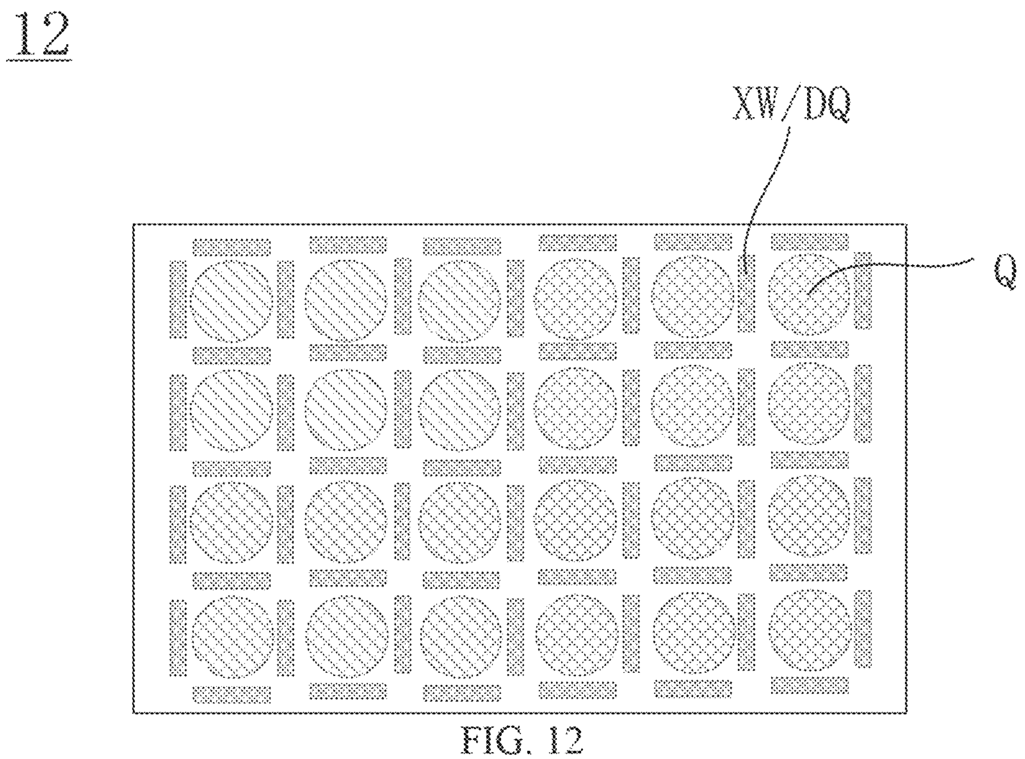
FIG. 12 is a schematic plane diagram of a deformable layer in FIG. 11 according to an embodiment of the present disclosure.

FIG. 10 is a schematic diagram of an unfolding state of a display module according to another embodiment of the present disclosure. FIG. 11 is a schematic diagram of an unfolding state of a display module according to another embodiment of the present disclosure. FIG. 12 is a schematic plane diagram of a deformable layer in FIG. 11.

In another technical solution of this embodiment of the present disclosure, as shown in FIG. 10 and FIG. 11, the limit structure XW includes a blocking wall DQ, and at least a part of the support structure Q is located between two adjacent blocking walls DQ. In this way, movement of the support structure Q can be blocked by the blocking wall DQ, which limits the movable space of the support structure Q.

In an embodiment of the present disclosure, as shown in FIG. 10, in the unfolding state of the display module 01, in a direction Z perpendicular to a plane of the flexible display panel 11, a length of the blocking wall DQ is smaller than a length of the support structure Q. Orthographic projection of the blocking wall DQ on the plane of the deformable layer 12 overlaps with orthographic projection of the support structure Q on the plane of the deformable layer 12, and a part of the support structure Q protrudes from the overlapping blocking wall DQ.

In this way, while the support structure Q is limited and fixed, adjacent two support structures Q can come into contact through the part that is of the support structure Q and protrudes from the blocking wall DQ, to further improve the stability of the deformable layer 12 after the deformation.

For example, still referring to FIG. 10, a spherical support structure Q is used as an example. The support structure Q includes an intermediate part QC, an upper part QS close to the first flexible layer 121, and a lower part QX close to the second flexible layer 122. The blocking wall DQ can be disposed on the first flexible layer 121. The upper part QS of the support structure Q is located between the two adjacent blocking walls DQ. The two adjacent support structures Q can come into contact through the intermediate part QC of the support structure Q.

Further, blocking walls DQ that overlap with a same support structure Q can be connected as a whole, so that the blocking wall DQ can limit and fix the support structure DQ multi-directionally, improving a capability of limiting the support structure Q.

It should be noted that FIG. 10 only illustrates a setting that the blocking wall DQ is disposed on the first flexible layer 121. The blocking walls DQ may alternatively be disposed on the second flexible layer 122, or both disposed on the first flexible layer 121 and the second flexible layer 122.

In an embodiment of the present disclosure, as shown in FIG. 11, in the unfolding state of the display module 01, in the direction Z perpendicular to the plane of the flexible display panel 11, the length of the blocking wall DQ is not smaller than the length of the support structure Q. In this case, the entire support structure Q can be located between the two adjacent blocking walls DQ. A capability of the blocking wall DQ in blocking the movement of the support structure Q is further improved.

Further, as shown in FIG. 12, the blocking wall DQ is disposed between any two adjacent support structures Q, so that the blocking wall DQ can limit and fix the support structure DQ multi-directionally, to further improve the capability of limiting the support structure Q. It can be understood that, a plurality of blocking walls DQ surrounding a same support structure Q can further be connected to be in one piece.

It should be noted that in some embodiments, the support structure Q can further be bonded to the first flexible layer 121 and the second flexible layer 122 to limit and fix the support structure Q.

Figure 13:
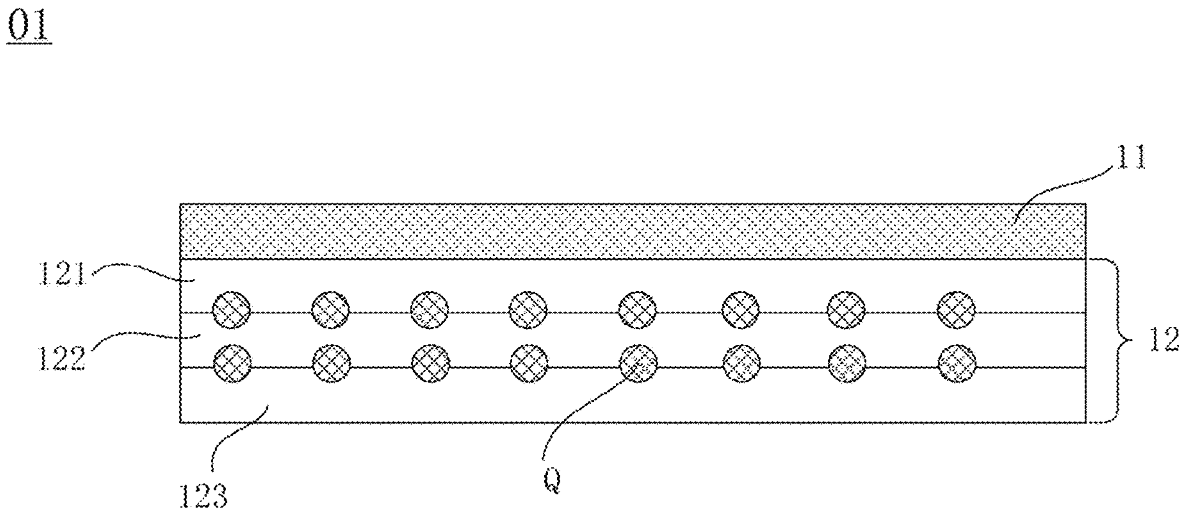
FIG. 13 is a schematic diagram of an unfolding state of a display module according to another embodiment of the present disclosure.
Figure 14:
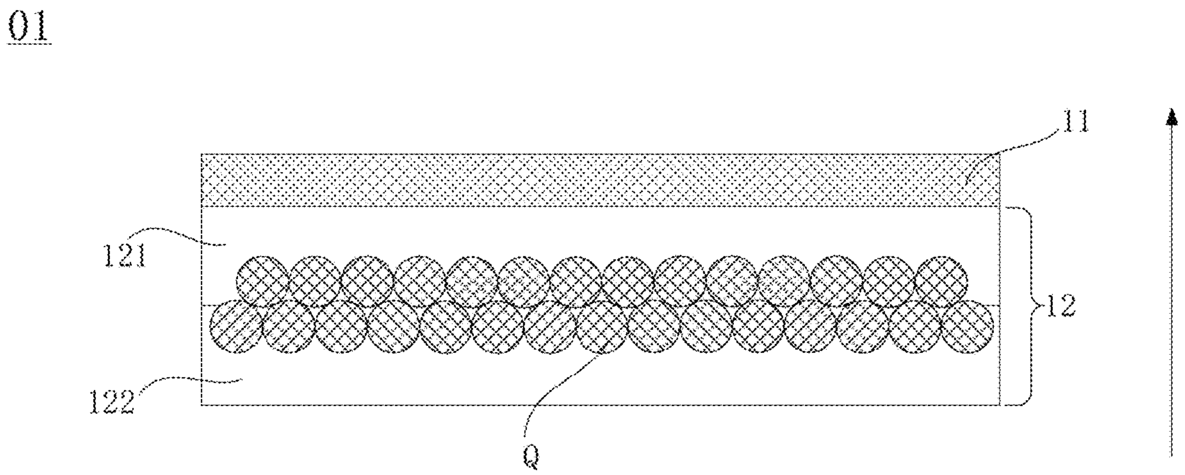
FIG. 14 is a schematic diagram of an unfolding state of a display module according to another embodiment of the present disclosure.

FIG. 13 is a schematic diagram of an unfolding state of a display module according to another embodiment of the present disclosure. FIG. 14 is a schematic diagram of an unfolding state of a display module according to another embodiment of the present disclosure.

In an embodiment of the present disclosure, in the unfolding state of the display module 01, at least one layer of the support structures Q is arranged in the deformable layer 12. In an embodiment of the present disclosure, each layer of support structures Q is located between two adjacent flexible layers.

For example, as shown in FIG. 1, one layer of the support structures Q are arranged in the deformable layer 12. In this case, all the support structures Q are located between the first flexible layer 121 and the second flexible layer 122. As shown in FIG. 13, two layers of support structures Q are arranged in the deformable layer 12. In this case, the deformable layer 12 further includes a third flexible layer 123, and the third flexible layer 123 may be located at a side of the second flexible layer 122 away from the first flexible layer 121. One layer of the support structures Q is located between the first flexible layer 121 and the second flexible layer 122, and the other layer of support structures Q is located between the second flexible layer 122 and the third flexible layer 123.

In addition, as shown in FIG. 14, when the two layers of support structures Q are arranged in the deformable layer 12, the two layers of support structures Q can further be stacked and come into contact with each other. In other words, there may be no flexible layer disposed between two adjacent layers of support structures Q. In this case, support structures Q located in different layers can be disposed in a staggered manner. In the unfolding state of the display module 01, in the direction Z perpendicular to the plane of the flexible display panel 11, centers of the support structures Q located in different layers may not be overlapped. This is conducive to reducing a thickness of the deformable layer 12 and making the display module 01 thin and light.

In an embodiment of the present disclosure, the support structure Q is arranged in layers in the deformable layer 12. This is conducive to preparing the deformable layer 12 in a process and limiting and fixing the support structure Q, and is conducive to avoiding a defect such as a protrusion or a depression in the flexible display panel 11 due to a protrusion or a depression in a bending process of the deformable layer 12. Moreover, a plurality of layers of support structures Q can further be disposed to improve structural stability of the deformable layer 12 in the bending state, thereby improving the structural stability of the display module 01.

Figure 15:
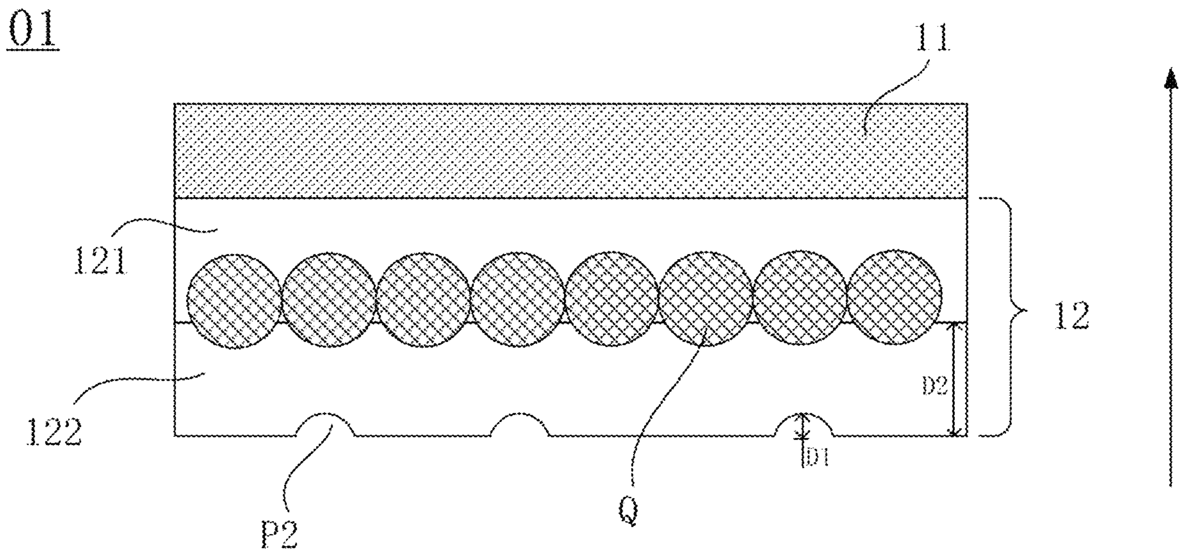
FIG. 15 is a schematic diagram of an unfolding state of a display module according to another embodiment of the present disclosure.

FIG. 15 is a schematic diagram of an unfolding state of a display module according to another embodiment of the present disclosure.

In an embodiment of the present disclosure, as shown in FIG. 15, in the unfolding state of the display module 01, the second flexible layer 122 is located at a side of the support structure Q away from the flexible display panel 11, and is provided with a stress relief groove P2.

In an embodiment of the present disclosure, the stress relief groove P2 may be a straight-line groove, a curved groove, or a wavy groove. This can increase structural diversity of the display module 01 and help to reduce the number of stress relief grooves P2 on the second flexible layer 122, which is conducive to simplifying the process.

In the bending process of the display module 01, bending stress on the second flexible layer 122 away from the flexible display panel 11 is relatively large. As a result, the second flexible layer 122 is prone to a wrinkle or a damage, which affects a service life of the display module 01.

Therefore, in an embodiment of the present disclosure, the stress relief groove P2 is disposed on the second flexible layer 122, so that the relatively large stress on the second flexible layer 122 can be released through the stress relief groove P2 in the bending process of the deformable layer 12. This helps to avoid the wrinkle or a tensile damage on the second flexible layer 122, thereby improving a service life of the deformable layer 12 and further improving the service life of the display module 01.

In an embodiment of the present disclosure, as shown in FIG. 15, in the unfolding state of the display module 01, in the direction Z perpendicular to the plane of the flexible display panel 11, the orthographic projection of the support structure Q on the plane of the deformable layer 12 covers orthographic projection of the stress relief groove P2 on the plane of the deformable layer 12. This is conducive to preventing the stress relief groove P2 from having an excessive volume to affect structural stability of the second flexible layer 122. In an embodiment of the present disclosure, still referring to FIG. 15, a depth D1 of the stress relief groove P2 is smaller than a thickness D2 of the second flexible layer 122. This can prevent the stress relief groove P2 from penetrating the second flexible layer 122, which is conducive to preventing an external impurity from entering an interior of the deformable layer 12 to affect mutual attraction between the support structures Q.

Further, as shown in FIG. 8, the stress relief groove P2 can be reused as the groove P1 that limits the support structure Q. The stress relief groove P2 does not penetrate the second flexible layer 122, which can prevent the support structure Q from exposing the second flexible layer 122 to loosely limit the support structure Q.

Figure 16:
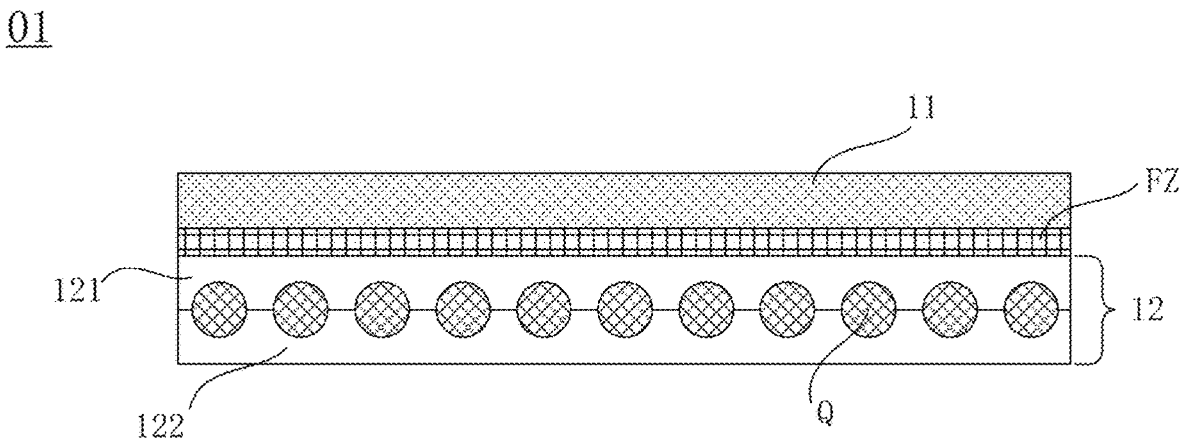
FIG. 16 is a schematic diagram of an unfolding state of a display module according to another embodiment of the present disclosure.

FIG. 16 is a schematic diagram of an unfolding state of a display module according to another embodiment of the present disclosure.

In an embodiment of the present disclosure, as shown in FIG. 16, the display module 01 further includes an auxiliary shaping structure FZ located at the side of the backlight surface of the flexible display panel 11. The auxiliary shaping structure FZ has certain strength and tensile performance, and can undergo a deformation with a shape change of an arrangement pattern of the support structure Q.

In an embodiment of the present disclosure, as shown in FIG. 16, the auxiliary shaping structure FZ is located between the deformable layer 12 and the flexible display panel 11.

In an embodiment of the present disclosure, all auxiliary shaping structure FZ is disposed on one surface.

In an embodiment of the present disclosure, the auxiliary shaping structure FZ can play a role in supporting the flexible display panel 11. In the bending state of the display module 01, the auxiliary shaping structure FZ can cooperate with the deformable layer 12 to better support the flexible display panel 11. This is conducive to further achieving the structural stability of the flexible display panel 11 in the bending state, thereby improving the structural stability of the display module 01.

Figure 17:
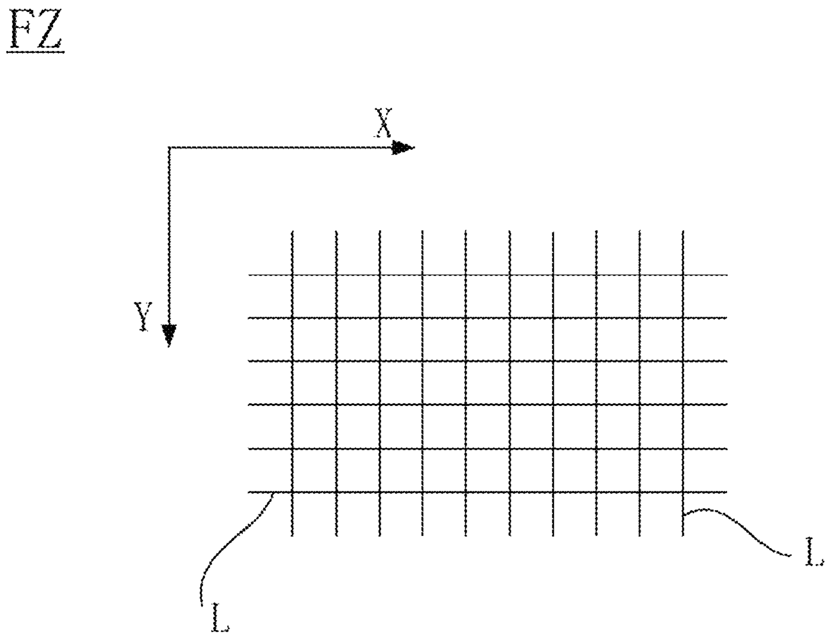
FIG. 17 is a schematic diagram of an auxiliary shaping structure according to an embodiment of the present disclosure.

FIG. 17 is a schematic diagram of an auxiliary shaping structure according to an embodiment of the present disclosure.

In the present disclosure, as shown in FIG. 17, the auxiliary shaping structure FZ includes auxiliary shaping lines L, and the auxiliary shaping lines intersecting with each other in extension directions form a mesh. In other words, the auxiliary shaping structure FZ may be a mesh structure.

For example, as shown in FIG. 17, the auxiliary shaping structure FZ includes auxiliary shaping lines L extending along a first direction X and auxiliary shaping lines L extending along a second direction Y. The first direction X intersects with the second direction Y. The auxiliary shaping lines L extending along the first direction X and the auxiliary shaping lines L extending along the second direction Y form a mesh.

In an embodiment of the present disclosure, as shown in FIG. 17, the first direction X is perpendicular to the second direction Y.

In an embodiment of the present disclosure, the auxiliary shaping line L is a steel wire.

In the present disclosure, in the bending process of the display module 01, the support structure Q may be pressed by a finger, which can easily cause the support structure Q to move in a thickness direction of the flexible display panel 11, resulting in poor stability of the arrangement pattern of the support structure Q. In an embodiment of the present disclosure, the auxiliary shaping lines L in the auxiliary shaping structure FZ can be set to form the mesh. When the support structure Q in the deformable layer 12 is arranged in an arbitrary shape, the reticulate auxiliary shaping lines L are easy to support the support structure Q in the direction perpendicular to the plane of the flexible display panel 11. This is conducive to reducing a movement capability of the support structure Q in the direction perpendicular to the plane of the flexible display panel 11, especially a movement ability of the spherical support structure Q in the direction perpendicular to the plane of the flexible display panel 11. This is conducive to avoiding displacement of the support structure Q caused by the pressing by the finger, thereby further improving stability of the arrangement pattern of the support structure Q and improving the structural stability of the display module 01.

It should be noted that in some embodiments, the extension direction of the auxiliary shaping line L can further be flexibly set based on an arrangement direction of the support structure Q, so that the auxiliary shaping line L can provide better support for the support structure Q.

Figure 18:
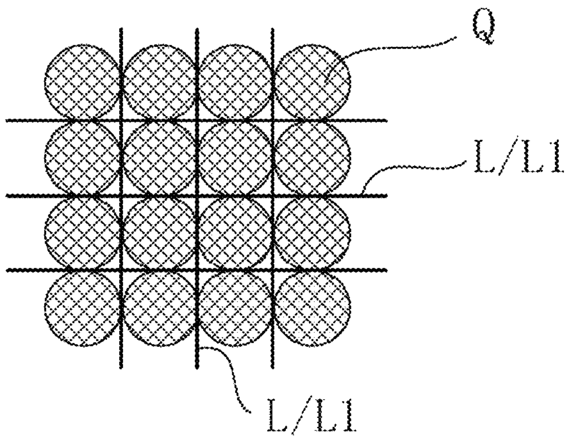
FIG. 18 is a schematic diagram of a correspondence between an auxiliary shaping line and a support structure according to an embodiment of the present disclosure.
Figure 19:
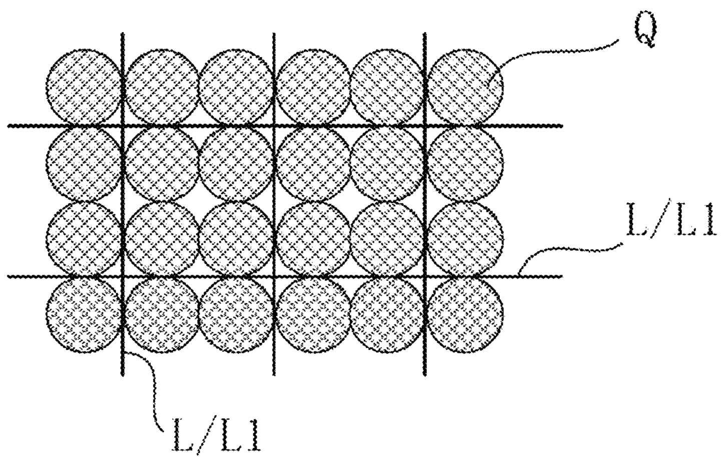
FIG. 19 is a schematic diagram of a correspondence between an auxiliary shaping line and a support structure according to an embodiment of the present disclosure.

FIG. 18 is a schematic diagram of a correspondence between an auxiliary shaping line and a support structure according to an embodiment of the present disclosure. FIG. 19 is a schematic diagram of another correspondence between an auxiliary shaping line and a support structure according to an embodiment of the present disclosure.

In an embodiment of the present disclosure, as shown in FIG. 18 and FIG. 19, the auxiliary shaping lines L include a first auxiliary shaping line L1. In the unfolding state of the display module 01, an orthographic projection of the first auxiliary shaping line L1 on the plane of the deformable layer 12 is located between orthographic projections of adjacent support structures Q on the plane of the deformable layer 12.

That is, in the unfolding state of the display module 01, when the adjacent support structures Q come into contact with each other, in the direction perpendicular to the plane of the flexible display panel 11, the orthographic projection of the first auxiliary shaping line L1 on the plane of the deformable layer 12 overlaps the orthographic projection of a contact point of the adjacent support structures Q on the plane of the deformable layer 12.

In the unfolding state of the display module 01, when the adjacent support structures Q do not come into contact with each other, in the direction perpendicular to the plane of the flexible display panel 11, the orthographic projection of the first auxiliary shaping line L1 on the plane of the deformable layer 12 may not overlap with the orthographic projection of the adjacent support structure Q on the plane of the deformable layer 12, and is located between the orthographic projection of the adjacent support structures Q on the plane of the deformable layer 12. It can be understood that, if a line width of the first auxiliary shaping line L1 is large, the orthographic projection of the first auxiliary shaping line L1 on the plane of the deformable layer 12 may cover orthographic projection of a region between the adjacent two support structures Q on the plane of the deformable layer 12. In this case, the orthographic projection of the first auxiliary shaping line L1 on the plane of the deformable layer 12 may partially overlap with the orthographic projection of the support structure Q on the plane of the deformable layer 12.

It should be noted that FIG. 18 and FIG. 19 only illustrate a situation in which the adjacent support structures Q come into contact with each other.

In an embodiment of the present disclosure, the orthographic projection of the first auxiliary shaping line L1 on the plane of the deformable layer 12 is set to be located between the orthographic projection of the adjacent support structures Q on the plane of the deformable layer 12. Therefore, the region between the adjacent support structures Q can be supported by the first auxiliary shaping line L1. Especially for the spherical support structure Q, the first auxiliary shaping line L1 can support a gap region enclosed by the support structures Q, thereby achieving a support effect on the support structure Q and avoiding the displacement of the support structure Q caused by the pressing of the finger.

In an embodiment of the present disclosure, as shown in FIG. 18, the orthographic projection of the first auxiliary shaping line L1 on the plane of the deformable layer 12 is located between orthographic projections of any two adjacent support structures Q on the plane of the deformable layer 12. This is conducive to increasing a density of the first auxiliary shaping line L1, thereby increasing a support range of the first auxiliary shaping line L1, and effectively supporting the support structure Q at any position.

In an embodiment of the present disclosure, as shown in FIG. 19, the orthographic projection of the first auxiliary shaping line L1 on the plane of the deformable layer 12 exists between orthographic projections of some two adjacent support structures Q on the plane of the deformable layer 12. The first auxiliary shaping lines L1 intersecting with each other in the extension directions form the mesh.

Therefore, when the support effect on the support structure Q is achieved, there is no need to prepare the auxiliary shaping structure FZ very finely, which is conducive to reducing a cost of process preparation.

Figure 20:
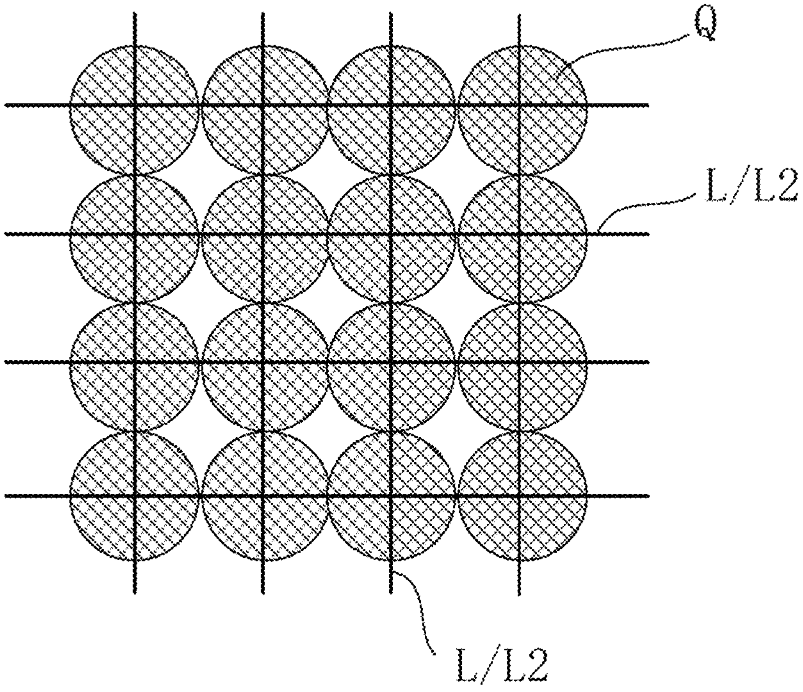
FIG. 20 is a schematic diagram of a correspondence between an auxiliary shaping line and a support structure according to an embodiment of the present disclosure.

FIG. 20 is a schematic diagram of another correspondence between an auxiliary shaping line and a support structure according to an embodiment of the present disclosure.

In an embodiment of the present disclosure, as shown in FIG. 20, the auxiliary shaping lines L include a second auxiliary shaping line L2. In the unfolding state of the display module 01, in the direction perpendicular to the plane of the flexible display panel 11, orthographic projection of the second auxiliary shaping line L2 on the plane of the deformable layer 12 overlaps with a center of the orthographic projection of the support structure Q on the plane of the deformable layer 12.

In other words, in the direction perpendicular to the plane of the flexible display panel 11, the second auxiliary shaping line L2 can limit the movement of the support structure Q.

In an embodiment of the present disclosure, the orthographic projection of the second auxiliary shaping line L2 on the plane of the deformable layer 12 is set to overlap with the center of the orthographic projection of the support structure Q on the plane of the deformable layer 12. This is conducive to increasing the structural diversity of the display module 01 and enhancing a capability of limiting movement of the support structure Q in the direction perpendicular to the plane of the flexible display panel 11. This is conducive to further avoiding the displacement of the support structure Q caused by the pressing by the finger and improving the stability of the arrangement pattern of the support structure Q.

Figure 21:
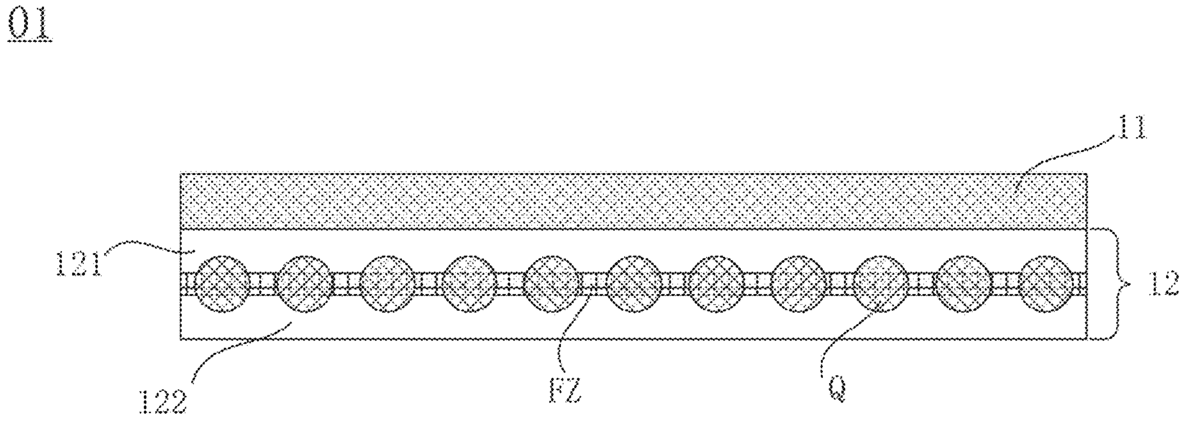
FIG. 21 is a schematic diagram of an unfolding state of a display module according to another embodiment of the present disclosure.

FIG. 21 is a schematic diagram of an unfolding state of a display module according to another embodiment of the present disclosure.

In an embodiment of the present disclosure, as shown in FIG. 21, the auxiliary shaping structure FZ is located in the deformable layer 12. In other words, the support structure Q and the auxiliary shaping structure FZ are located in a same film layer. This is conducive to improving a capability of driving, by a change of the arrangement pattern of the support structure Q, the auxiliary shaping structure FZ to undergo deformation, thereby improving deformation consistency between the deformable layer 12 and the flexible display panel 11, and improving a bending effect of the flexible display panel 11.

Figure 22:
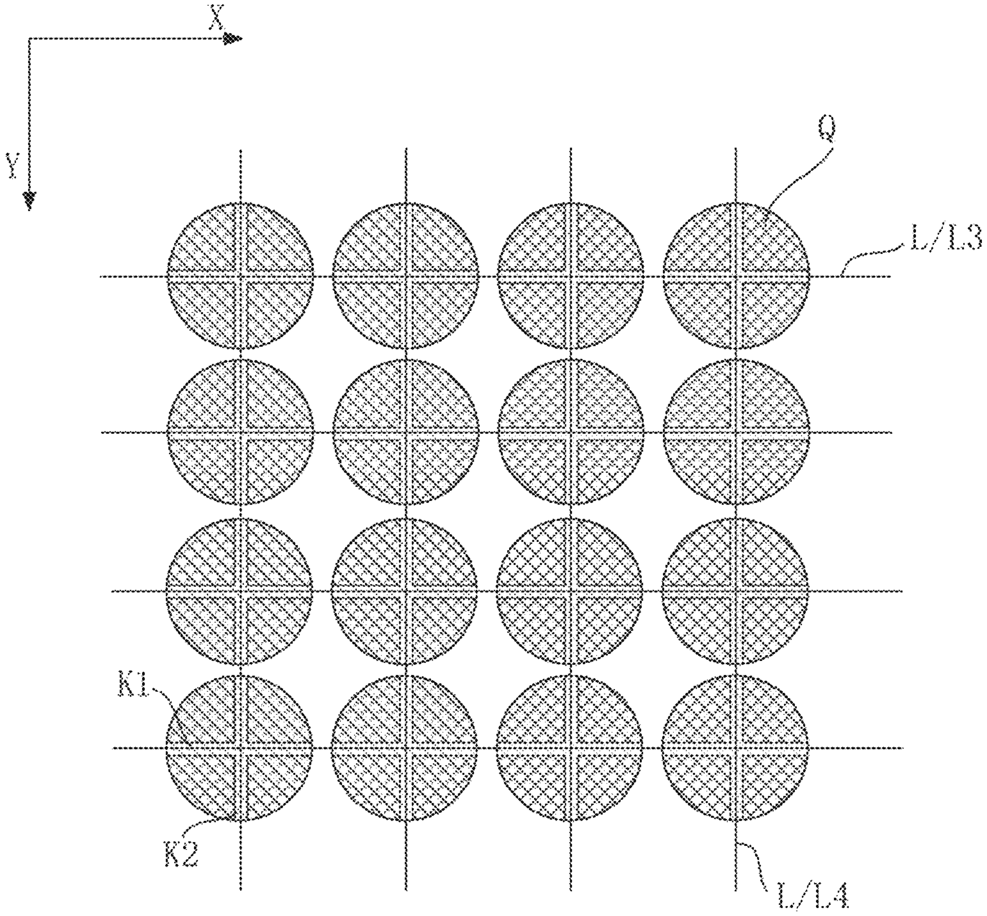
FIG. 22 is a schematic diagram of a correspondence between an auxiliary shaping line and a support structure in FIG. 21 according to an embodiment of the present disclosure.

FIG. 22 is a schematic diagram of a correspondence between the auxiliary shaping line and the support structure in FIG. 21.

In an implementation of this embodiment of the present disclosure, as shown in FIG. 20, the auxiliary shaping lines L of the auxiliary shaping structure FZ include a third auxiliary shaping line L3 and a fourth auxiliary shaping line L4, and the support structure Q includes a through-hole that runs radially through the support structure Q. The third auxiliary shaping line L3 penetrates, through the through-hole K, the support structures Q arranged along the first direction X, and the fourth auxiliary shaping line L4 penetrates, through the through-hole, the support structures Q arranged along the second direction Y. The first direction X intersects with the second direction Y.

In an embodiment of the present disclosure, as shown in FIG. 22, a same support structure Q includes a through-hole K1 and a through-hole K2. The through-hole K1 and the through-hole K2 can penetrate a center of the support structure Q. The through-hole K1 extends along the first direction X, and the third auxiliary shaping line L3 penetrates, through the through-hole K1, the support structures Q arranged along the first direction X. The through-hole K2 extends along the second direction Y, and the fourth auxiliary shaping line L4 penetrates, through the through-hole K2, the support structures Q arranged along the second direction Y.

In this implementation, the third auxiliary shaping line L3 and the fourth auxiliary shaping line L4 are set to penetrate the support structure Q from different directions. On one hand, a capability of limiting and fixing the support structure Q is further improved, which is conducive to further achieving the stability of the arrangement pattern of the support structures Q in the bending process of the display module 01. On the other hand, the capability of driving, by the change of the arrangement pattern of the support structure Q, the auxiliary shaping structure FZ to undergo the deformation can be improved, and consistency between the arrangement pattern of the support structure Q and a shape of the auxiliary shaping structure FZ is improved. This is conducive to improving the deformation consistency between the deformable layer 12 and the flexible display panel 11, and improving the bending effect of the flexible display panel 11.

Figure 23:
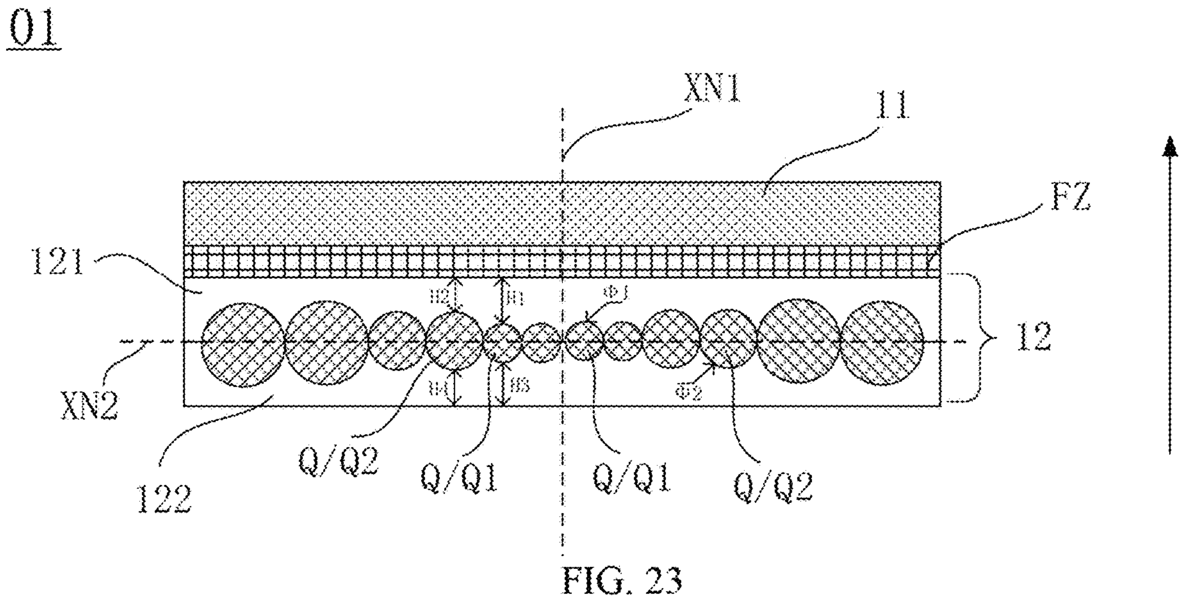
FIG. 23 is a schematic diagram of an unfolding state of a display module according to another embodiment of the present disclosure.

FIG. 23 is a schematic diagram of an unfolding state of a display module according to another embodiment of the present disclosure.

In an embodiment of the present disclosure, as shown in FIG. 23, the display module 01 includes a virtual bending axis XN1. The display module 01 can be bent along the virtual bending axis XN1. In other words, both the deformable layer 12 and the flexible display panel 11 can be bent along the virtual bending axis XN1.

The support structures Q include a first support structure Q1 and a second support structure Q2. In the unfolding state of the display module 01, the first support structure Q1 and the second support structure Q2 are located at a same side of the virtual bending axis XN1. It can be understood that, the first support structure Q1 and the second support structure Q2 can be disposed at two opposite sides of the virtual bending axis XN1. The first support structures Q1 at the two opposite sides of the virtual bending axis XN1 can be symmetrically arranged. The second support structures Q2 at the two opposite sides of the virtual bending axis XN1 can further be symmetrically arranged.

At the same side of the virtual bending axis XN1, the first support structure Q1 is close to the virtual bending axis XN1 relative to the second support structure Q2, and a size of the first support structure Q1 is smaller than a size of the second support structure Q2.

For example, as shown in FIG. 23, when the support structure Q is spherical, a diameter Φ1 of the first support structure Q1 is smaller than a diameter Φ2 of the second support structure Q2.

In an embodiment of the present disclosure, if the size of the first support structure Q1 closer to the virtual bending axis XN1 is smaller, the deformable layer 12 can include more flexible layers in a region closer to the virtual bending axis XN1. The flexible layer is prone to bending, which is conducive to reducing a bending difficulty of the deformable layer 12, thereby making the display module 01 be easily bent.

In an embodiment of the present disclosure, in the deformable layer 12, a size of the support structure Q gradually increases in a direction away from the virtual bending axis XN1.

Still referring to FIG. 23, in an embodiment of the present disclosure, in the unfolding state of the display module 01, a center of the first support structure Q1 and a center of the second support structure Q2 are located on a first virtual straight line XN2. The first virtual straight line XN2 is parallel to the plane of the flexible display panel 11.

In other words, in the unfolding state of the display module 01, the first virtual straight line XN2 is a horizontal straight line. Although the size of the first support structure Q1 is different from the size of the second support structure Q2, the center of the first support structure Q1 and the center of the second support structure Q2 are located on the same horizontal straight line.

In an embodiment of the present disclosure, in the unfolding state, the center of the first support structure Q1 and the center of the second support structure Q2 are set to be on the same horizontal straight line. This is conducive to achieving a same difficulty and effect for the inward bending and the outward bending of the display module 01, thereby making the display module 01 suitable for different scenarios, and improving universality of the application scenarios of the display module 01.

In an embodiment of the present disclosure, as shown in FIG. 23, in the display module 01, the deformable layer 12 includes the first flexible layer 121 and the second flexible layer 122. The second flexible layer 122 is located at a side of the first flexible layer 121 away from the flexible display panel 11, and the support structures Q are located between the first flexible layer 121 and the second flexible layer 122. The first flexible layer 121 and the second flexible layer 122 can be configured to support and fix the support structure Q.

Along the direction Z perpendicular to the plane of the flexible display panel 11, a thickness H1 of the first flexible layer 121 overlapping with the first support structure Q1 is greater than a thickness H2 of the first flexible layer 121 overlapping with the second support structure Q2, and/or a thickness H3 of the second flexible layer 122 overlapping with the first support structure Q1 is greater than a thickness H4 of the second flexible layer 122 overlapping with the second support structure Q2.

In other words, it may be set only that the thickness H1 of the first flexible layer 121 overlapping with the first support structure Q1 is greater than the thickness H2 of the first flexible layer 121 overlapping with the second support structure Q2. Alternatively, it may be set only that the thickness H3 of the second flexible layer 122 overlapping with the first support structure Q1 is greater than the thickness H4 of the second flexible layer 122 overlapping with the second support structure Q2. Alternatively, as shown in FIG. 21, it may be set that the thickness H1 of the first flexible layer 121 overlapping with the first support structure Q1 is greater than the thickness H2 of the first flexible layer 121 overlapping with the second support structure Q2, and the thickness H3 of the second flexible layer 122 overlapping with the first support structure Q1 is greater than the thickness H4 of the second flexible layer 122 overlapping with the second support structure Q2.

In an embodiment of the present disclosure, because the size of the first support structure Q1 is small, the thickness of the first flexible layer 121 overlapping with the first support structure Q1 and/or the thickness of the second flexible layer 122 overlapping with the first support structure Q1 are/is relatively large. This is conducive to achieving that an overall thickness of the first support structure Q1 and its overlapping first flexible layer 121 and the second flexible layer 122 is equivalent to an overall thickness of the second support structure Q2 and its overlapping first flexible layer 121 and the second flexible layer 122 in the direction Z perpendicular to the plane of the flexible display panel 11, which is conducive to achieving uniformity of the thickness of the deformable layer 12 and improving stability of the support for the flexible display panel 11.

It should be noted that in the display module 01 provided in the present disclosure, the support structures Q may be disposed on the entire surface in the deformable layer 12, or may be disposed only in a region that needs to be bent as needed.

Figure 24:
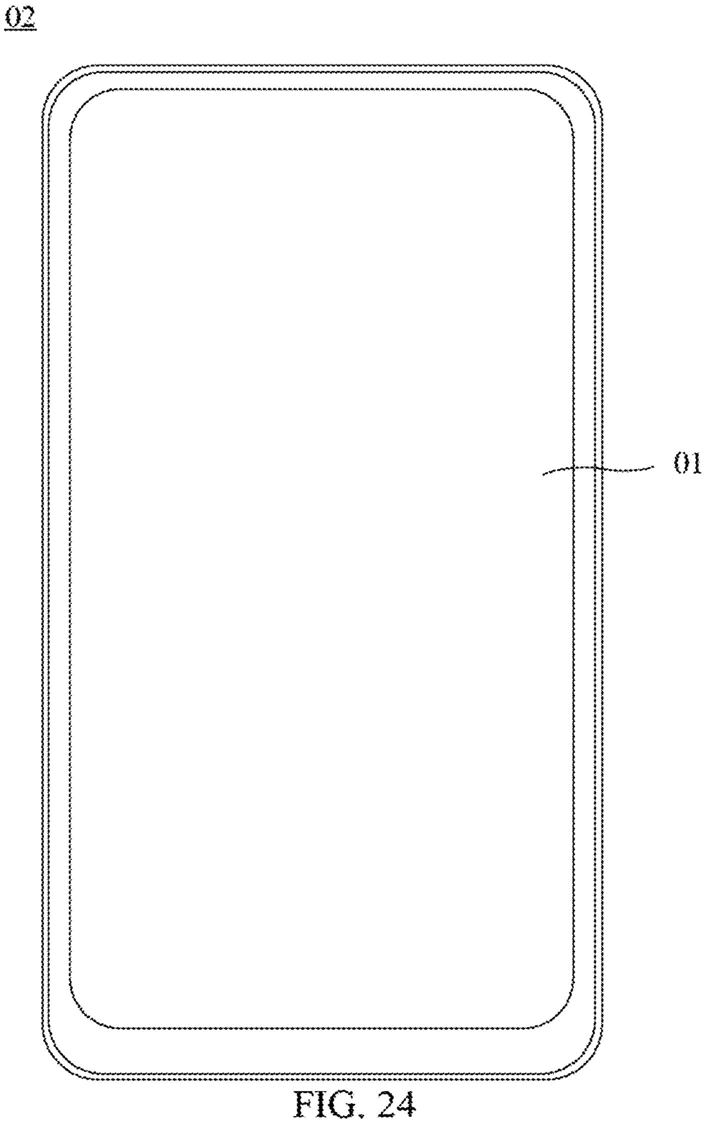
FIG. 24 is a schematic diagram of a display apparatus according to an embodiment of the present disclosure.

FIG. 24 is a schematic diagram of a display apparatus according to an embodiment of the present disclosure.

As shown in FIG. 24, the present disclosure provides a display apparatus 02, including the display module 01 described in the foregoing embodiments. For example, the display apparatus 02 provided in this embodiment of the present disclosure may be an electronic device such as a mobile phone or a tablet personal computer. This is not specifically limited in the present disclosure.

In the display apparatus 02, support structures Q are disposed in a deformable layer 12, and mutual attraction between the support structures Q can enable the support structures Q to form an arbitrary shape, thereby driving the deformable layer 12 to undergo deformation. A flexible display panel 11 follows the deformation of the deformable layer 12 to undergo deformation. In this way, the flexible display panel 11 can be bent at any angle, and can be bent at different positions by setting positions of the support structures Q, which is conducive to increasing application scenarios of the display apparatus 02.

The above are merely exemplary embodiments of the present disclosure, which, as mentioned above, are not used to limit the present disclosure. Whatever within the principles of the present disclosure, including any modification, equivalent substitution, improvement, etc., shall fall into the protection scope of the present disclosure.

What is claimed is:

1. A display module, comprising a flexible display panel, an auxiliary shaping structure and a deformable layer, wherein the deformable layer is located at a side of a backlight surface of the flexible display panel; and the deformable layer comprises a plurality of support structures, and adjacent support structures of the plurality of support structures attract each other by magnetic force;
   - the display module has an unfolding state, and in the unfolding state, the plurality of support structures are arranged in a plane of the deformable layer; and
   - the auxiliary shaping structure is located at the side of the backlight surface of the flexible display panel; the auxiliary shaping structure comprises auxiliary shaping lines, and the auxiliary shaping lines intersecting with each other in extension directions form a mesh; the auxiliary shaping lines comprise a third auxiliary shaping line and a fourth auxiliary shaping line, and each support structure of the plurality of support structures comprises a through-hole that runs radially through the support structure; and the third auxiliary shaping line penetrates, through the through-hole, at least two of the plurality of support structures arranged along a first direction, and the fourth auxiliary shaping line penetrates, through the through-hole, at least two of the plurality of support structures arranged along a second direction, wherein the first direction intersects with the second direction.

2. The display module according to claim 1, wherein the adjacent support structures of the plurality of support structures are in contact with each other.

3. The display module according to claim 1, wherein in the unfolding state, at least one layer of the plurality of support structures is arranged in the deformable layer.

4. The display module according to claim 1, wherein the deformable layer comprises a first flexible layer and a second flexible layer; and the plurality of support structures is located between the first flexible layer and the second flexible layer.

5. The display module according to claim 4, wherein at least one of the first flexible layer and the second flexible layer is provided with a limit structure, and the limit structure is configured to limit movable space of each support structure of the plurality of support structures.

6. The display module according to claim 5, wherein the limit structure comprises a groove, and the plurality of support structure is located in the groove.

7. The display module according to claim 5, wherein the limit structure comprises a plurality of blocking walls, and at least a part of the plurality of support structures is located between two adjacent ones of the plurality of blocking walls.

8. The display module according to claim 4, wherein in the unfolding state, the second flexible layer is located at a side of the support structure away from the flexible display panel, and is provided with a stress relief groove.

9. The display module according to claim 8, wherein a depth of the stress relief groove is smaller than a thickness of the second flexible layer.

10. The display module according to claim 1, wherein the auxiliary shaping lines comprise a first auxiliary shaping line, and in the unfolding state, orthographic projection of the first auxiliary shaping line on the plane of the deformable layer is located between orthographic projection of the adjacent ones of the plurality of support structures on the plane of the deformable layer.

11. The display module according to claim 1, wherein the auxiliary shaping lines comprise a second auxiliary shaping line, and in the unfolding state, orthographic projection of the second auxiliary shaping line on the plane of the deformable layer overlaps with a center of orthographic projection of each support structure of the plurality of support structures on the plane of the deformable layer.

12. The display module according to claim 1, wherein the auxiliary shaping structure is located between the deformable layer and the flexible display panel.

13. The display module according to claim 1, wherein the display module comprises a virtual bending axis, and the plurality of support structures comprise a first support structure and a second support structure; and in the unfolding state, the first support structure and the second support structure are located at a same side of the virtual bending axis;

wherein the first support structure is close to the virtual bending axis relative to the second support structure, and a size of the first support structure is smaller than a size of the second support structure.

14. The display module according to claim 13, wherein in the unfolding state, a center of the first support structure and a center of the second support structure are located on a first virtual straight line, and the first virtual straight line is parallel to a plane of the flexible display panel.

15. The display module according to claim 14, wherein the deformable layer comprises a first flexible layer and a second flexible layer; and the plurality of support structures are located between the first flexible layer and the second flexible layer; and along a direction perpendicular to the plane of the flexible display panel, a thickness of the first flexible layer overlapping with the first support structure is greater than a thickness of the first flexible layer overlapping with the second support structure, and/or, a thickness of the second flexible layer overlapping with the first support structure is greater than a thickness of the second flexible layer overlapping with the second support structure.

16. The display module according to claim 1, wherein the support structure has magnetism.

17. A display apparatus, comprising a display module, wherein the display module, comprising a flexible display panel, an auxiliary shaping structure and a deformable layer, wherein the deformable layer is located at a side of a backlight surface of the flexible display panel; and the deformable layer comprises a plurality of support structures, and adjacent support structures of the plurality of support structures attract each other by magnetic force;

the display module has an unfolding state, and in the unfolding state, the plurality of support structures are arranged in a plane of the deformable layer; and the auxiliary shaping structure is located at the side of the backlight surface of the flexible display panel; the auxiliary shaping structure comprises auxiliary shaping lines, and the auxiliary shaping lines intersecting with each other in extension directions form a mesh; the auxiliary shaping lines comprise a third auxiliary shaping line and a fourth auxiliary shaping line, and each support structure of the plurality of support structures comprises a through-hole that runs radially through the support structure; and the third auxiliary shaping line penetrates, through the through-hole, at least two of the plurality of support structures arranged along a first direction, and the fourth auxiliary shaping line penetrates, through the through-hole, at least two of the plurality of support structures arranged along a second direction, wherein the first direction intersects with the second direction.

* * * * *